United States Patent [19]

MacPherson et al.

[11] 4,309,715
[45] Jan. 5, 1982

[54] INTEGRAL TURN-ON HIGH VOLTAGE SWITCH

[75] Inventors: William F. MacPherson, Winfield Township, DuPage County, Ill.; Robert S. Scott, New Providence; Peter W. Shackle, Bridgewater, both of N.J.

[73] Assignee: Bell Telephone Laboratories, Incorporated, Murray Hill, N.J.

[21] Appl. No.: 107,776

[22] Filed: Dec. 28, 1979

[51] Int. Cl.³ ............................................. H01L 29/00
[52] U.S. Cl. ........................................ 357/37; 357/21; 357/22; 357/23; 357/38; 357/39; 357/41; 357/49
[58] Field of Search ..................... 357/21, 22, 23, 38, 357/37, 39, 41, 49

[56] References Cited
U.S. PATENT DOCUMENTS
3,722,079  3/1973  Beasom .................................. 357/34

Primary Examiner—Edward J. Wojciechowicz
Attorney, Agent, or Firm—Irwin Ostroff

[57] ABSTRACT

A high voltage solid-state switch uses a dielectrically isolated lightly doped p— type semiconductor body with a heavily doped p+ type anode region, a heavily doped n+ type gate region, a moderately doped p type shield region, and a heavily doped n+ type cathode region. The shield region surrounds the cathode region. Separate electrodes contact the anode, gate, shield, and cathode regions. The gate and cathode regions also act as the collector-emitter output circuitry of an n-p-n transistor with the shield region acting as the base. With the shield (base) region forward-biased with respect to the cathode or gate regions, the n-p-n transistor is biased on and the collector and emitter are rapidly pulled close to each other in potential. With proper operating potentials applied to the anode and cathode regions, the switch rapidly assumes an "ON" state when the potential of the shield (base) region is set to a level which biases the n-p-n transistor ON. The integral n-p-n transistor serves to rapidly turn the switch to the ON state and only marginally increases the amount of silicon area needed to implement the switch.

10 Claims, 3 Drawing Figures

INTEGRAL TURN-ON HIGH VOLTAGE SWITCH

TECHNICAL FIELD

This invention relates to solid-state structures and, in particular, to high voltage solid-state switches useful in telephone switching systems and many other applications.

BACKGROUND OF THE INVENTION

High voltage solid-state switches, such as those disclosed in copending U.S. patent application Ser. Nos. 972,056, 972,021, 972,022, and 971,886, filed Dec. 20, 1978, and having a common assignee with the present application, comprise a p− type semiconductor body with a p+ type anode region, an n+ type gate region, a p type shield region, and an n+ type cathode region. In three of these applications the semiconductor body is dielectrically isolated from a semiconductor support (substrate). In the other an n type semiconductor support (substrate) is in contact with the semiconductor body and serves as the gate region. Typically, each of the switches is turned to the "ON" (conducting) state by applying operating potentials to the anode and cathode regions while maintaining the gate region at a potential level which is insufficient to essentially cause a cross-sectional portion of the semiconductor body between the anode and cathode regions to be at a higher potential than the anode, cathode, and/or shield regions and to be depleted. The switches are turned to the "OFF" (nonconducting) state by raising the potential of the gate region to a level which essentially completely depletes a cross-sectional portion of the semiconductor body between the anode and cathode regions and raises the potential of the cross-sectional portion to a level which is more positive in potential than the anode, cathode, and/or shield regions. These high voltage switches have been denoted as gated diode switches (GDSs). A similar type of dielectrically isolated switch is described in copending U.S. patent application, Ser. No. 107,775 (A. R. Hartman-T. J. Riley-P. W. Shackle Case No. 16-12-16) which is being filed concurrently with the present application and in which there is a common assignee. This switch operates in a similar manner to the gated diode switches and has similar characteristics. Control circuitry, such as that described in copending U.S. patent applications Ser. Nos. 972,023 and 972,024, filed Dec. 20, 1978, with the assignee being the same as the present assignee, is coupled to the gate region of each switch for controlling the state thereof. In some cases this control circuitry acts more slowly than may be desired.

It is desirable to have a solid-state switch of the type discussed hereinabove which has integral thereto some control circuitry that facilitates relatively rapid switching of the switch and which does not materially alter the size of the switch.

SUMMARY OF THE INVENTION

The present invention is essentially an all solid-state high voltage switch structure which, in one illustrative embodiment, comprises a semiconductor body whose bulk is of p− type conductivity and which has a major surface. Separate p+ type conductivity anode and p type conductivity shield (base) regions exist in the semiconductor body. The shield (base) region surrounds a cathode region which is of n+ type conductivity. An n+ type gate region is separated from the anode and shield regions by portions of the bulk of the semiconductor body. The anode, cathode, and shield (base) regions each have a portion which is common with the major surface. The resistivity of the anode, cathode, and gate regions is low compared to the resistivity of the bulk portion of the semiconductor body. The resistivity of the shield region is intermediate between that of the bulk of the semiconductor body and the anode region. Each of the regions has a separate electrode coupled thereto. In this embodiment, a semiconductor support member is isolated from the semiconductor body by a dielectric layer and the gate region has a portion which is common with the major surface. In another embodiment, a semiconductor support member of n type conductivity and resistivity that is low compared to that of the bulk of the semiconductor body is in contact with a second surface of the semiconductor body and serves as the gate region of the structure. A separate electrode is coupled to the support member. In both embodiments the gate and cathode regions serves as the collector-emitter circuitry of an n-p-n transistor with the shield region serving as the base. This n-p-n transistor is an integral part of the switch and can be controlled by varying the potential of the shield (base) region so as to turn the transistor on. This causes the gate and cathode regions to be drawn close to the same potential and thereby sets the high voltage switch to an ON state. In still another embodiment, the semiconductor body is of n− type conductivity.

In the first two embodiments, the switch structure is designed to be in an "OFF" (nonconducting) state if the potential of the gate region is sufficient to essentially completely deplete a cross-sectional portion of the bulk of the semiconductor body between the anode and cathode regions and to cause the potential of that cross-sectional portion to be greater than that of the anode, cathode and/or shield regions. In the third embodiment, the OFF state is achieved if the potential of a cross-sectional portion of the semiconductor body between the anode and cathode regions is at a greater potential than that of the anode, cathode, and/or shield regions. In all three embodiments with the anode and cathode regions at operating potentials, the "ON" (conducting) state is achieved by adjusting the potential of the shield region to a level which turns on the integral n-p-n transistor and thereby brings the gate and cathode regions close to each other in potential. This rapidly discharges the gate and thus facilitates a relatively rapid turn on of the switch.

A structure as described hereinabove can be coupled to a similar second structure which does not have an electrode coupled to the shield region thereof to form a bidirectional switch with the gate regions of both structures being coupled together and the anode and cathode regions of the first structure being coupled to the cathode and anode regions, respectively, of the second structure. Two structures, both in accordance with the structure of the present invention, could likewise be coupled together to form a bidirectional switch.

These and other features of the invention are better understood from a consideration of the following detailed description taken in conjunction with the drawings.

DETAILED DESCRIPTION

Figure 1:
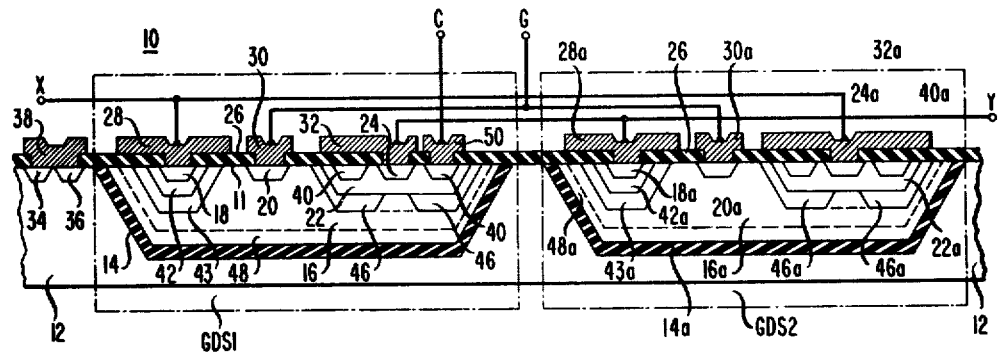
FIG. 1 illustrates a structure in accordance with an illustrative embodiment of the invention.

Referring now to FIG. 1, there is illustrated a semiconductor structure 10 comprising two gated diode switches, GDS1 and GDS2, which are illustrated within dashed line rectangles and are both formed on a common support member 12. GDS2 is disclosed and described in copending U.S. patent application Ser. No. 107,774, now abandoned, which has a common assignee and is being filed concurrently with this application. Support member 12 is typically a semiconductor wafer or a substrate. Dielectric layers 14 and 14a separate monocrystalline semiconductor bodies 16 and 16a, respectively, from support member 12 and from each other. Support member 12 has a major surface 11 and bodies 16 and 16a each have a portion that is common with surface 11. Whereas only two gated diode switches are illustrated, a plurality of dielectrically isolated gated diode switches of the type of GDS1 and/or GDS2 can be formed in a common semiconductor wafer or substrate 12.

GDS1 and GDS2 are illustrated having electrical connections therebetween which facilitate the use thereof as a bidirectional high voltage switch. GDS1 and GDS2 need not be electrically connected and each can function independently of the other.

In one typical embodiment, support member 12 is a semiconductor wafer (substrate) of n or p type conductivity and semiconductor bodies 16 and 16a have bulk portions thereof which are of p− type conductivity. The semiconductor regions contained within semiconductor body 16 are very similar to those contained in body 16a. A localized anode region 18, which is typically of p+ type conductivity, is included in body 16 and has a portion thereof that extends to surface 11. Surrounding anode region 18 is a p type region 42 which also has a portion thereof which extends to surface 11. Surrounding region 42 is a p− type region 43 which has a portion thereof which extends to surface 11. The conductivity of region 42 is intermediate between that of anode region 18 and semiconductor body 16 and the conductivity of region 43 is intermediate between region 42 and semiconductor body 16. Electrode 28 is illustrated making contact to region 18. Electrode 28 is separated from portions of surface 11 other than those over the exposed portion of region 18 by dielectric layer 26. A localized gate region 20 of n+ type conductivity is included in body 16 and has a portion thereof which extends to surface 11 and is separated from region 42 by portions of the bulk of semiconductor body 16. An electrode 30 contacts region 20 at surface 11. Electrode 30 is separated from portions of surface 11 other that those over the exposed portion of region 20 by dielectric layer 26. A localized cathode region 24, which is of n+ type conductivity, is included in body 16 and is separated from region 20 by portions of the bulk of semiconductor body 16. Region 24 is surrounded by a p+ type guard ring 40 which, in turn, is surrounded by a p type region 22 which, in turn, is surrounded by a guard ring like p− type region 46. Region 46 can extend, as is illustrated by the dashed line, to essentially completely surround region 22, except for the portions thereof common to surface 11. Region 46 is separated from regions 20 and 43 by portions of the bulk of semiconductor body 16. Electrode 32 contacts region 24 and a separate electrode 50 contacts region 40. Both electrodes are separated from portions of surface 11 other than over the respective exposed portion of regions 24 and 40. A layer 48 of n type conductivity exists between the dielectric layer 14 and semiconductor body 16. Layer 48, which is part of a preferred embodiment, is shown in dashed line since it is optional. Gate region 20 also serves as the collector of a lateral n-p-n transistor with cathode region 24 serving as the emitter and regions 46, 22, and 40 serving as the base.

Semiconductor body 16a contains regions which are very similar to those contained within semiconductor body 16 with the exception of the fact that the p+ type guard ring region 40a does not have a separate electrical contact thereto as does guard ring 40.

GDS1 is typically operated as a switch which is characterized by a low impedance between anode region 18 and cathode region 24 when in the ON (conducting) state and as a high impedance between said two regions when in the OFF (nonconducting) state. With operating potentials applied to anode region 18 and cathode region 24, the potential applied to gate region 20 determines the state of the switch. Conduction between anode region 18 and cathode region 24 can occur if the potential of the gate region 20 is near or below the potential of the anode region 18, cathode region 24, and region 22. During the ON state holes are injected into body 16 from anode region 18 and electrons are injected into body 16 from cathode region 24. This effectively lowers the resistance of body 16 such that the resistance between anode region 18 and cathode region 24 is relatively low when GDS1 is operating in the ON state. This type of operation is denoted as dual carrier injection and the type of structure described therein has been denoted as a gated diode switch (GDS). Guard ring region 40 and regions 22 and 46 help limit the punch-through of a depletion layer formed during operation between gate region 20 and cathode region 24 and help to inhibit the formation of a surface inversion layer between these two regions. In addition, they facilitate gate region 20 and cathode region 24 being relatively closely spaced apart. This facilitates relatively low resistance between anode region 18 and cathode region 22 during the ON state.

Substrate 12 is typically held at the most positive potential level available. Conduction between anode region 18 and cathode region 24 is inhibited or cut off if the potential of gate region 20 is sufficiently more positive than that of anode region 18 and cathode region 24. The amount of excess positive potential needed to inhibit or cut off conduction is a function of the geometry and impurity concentration (doping) levels of GDS1. This positive gate potential causes the portion of body 16 between gate region 20 and the portion of dielectric layer 14 therebelow to be depleted such that the potential of that portion of the body is more positive than that of anode region 18 and cathode region 24. This positive potential barrier inhibits the conduction of holes from anode region 18 to cathode region 24. It essentially pinches off body 16 against dielectric layer 14 in the bulk portion of semiconductor body 16 below gate region 20 and extending down to dielectric layer 14. It also serves to collect electrons emitted at cathode region 24 before they can reach anode region 18. Control circuitry capable of supplying the needed gate potentials and absorbing the electrons is illustrated and described in copending U.S. patent application Ser. No. 972,023, filed Dec. 20, 1978, and in which there is a common assignee. Other control circuitry capable of controlling GDS1 and/or GDS2 is illustrated and described in U.S. Pat. No. 4,250,409 and U.S. patent application Ser. No. 107,777, filed concurrently with the present application and in which there is a common assignee with the present application.

The ON state can be achieved by allowing gate electrode 30 to electrically float in potential, forward-biasing the anode region 18 with respect to the cathode region 24, and applying a potential to electrode 50 which forward-biases the base-emitter junction comprising base regions 46, 22, 40 and emitter (cathode) region 24. Once GDS1 is on, if electrode 50 is allowed to electrically float in potential, then GDS1 can be maintained in the ON state with the potential of gate region 20 at the same or a more positive level than anode region 18 and cathode region 24, so long as the potential of gate region 20 is below the level which essentially completely depletes a vertical cross-sectional portion of semiconductor body 16 between anode region 18 and cathode region 24 and from surface 11 to the top of dielectric layer 14 and causes the potential of this cross-sectional portion to be greater than that of the anode, cathode, and/or regions 18, 24, 22, 40, and 46. With gate region 20 held at such a potential level, the junction diode comprising semiconductor body 16 and gate region 20 has a zero forward-bias or is reverse-biased.

As has been earlier denoted, region 20, in addition to serving as the gate terminal of the gated diode switch, serves as the collector of a lateral n-p-n transistor with regions 46 and 22 serving as the base and region 24 serving as the emitter. Region 40, which also serves as part of the base, is typically of p+ type conductivity and, thus, serves as an electrical contact to region 22. Electrode 50 contacts region 40 and thus allows the base of the n-p-n transistor to be controlled. If electrode 50 is held at a position potential with respect to electrode 32, then the n-p-n transistor is biased on and the potential between gate region 20 (the collector of the transistor) and cathode region 24 (the emitter of the transistor) is relatively small. Typically this collector-emitter voltage is on the order of several tenths to several volts. The potential of gate region 20 is thus drawn to a level close to that of the cathode region 24. This effectively reduces the gate potential to a level which is insufficient to cause the GDS to be in the OFF state with proper operating potentials applied to the anode and cathode regions. The adjusting of the potential applied to electrode 50 to foward-bias the n-p-n transistor facilitates GDS1 being relatively rapidly switched to the ON state.

Semiconductor body 16a contains essentially the same regions as semiconductor body 16, except that guard ring 40a does not have an electrical contact thereto. Thus, no external control of the base potential of the n-p-n transistor which comprises region 20a as the collector, regions 46a, 22a, and 40a as the base, and region 24a as the cathode is possible. The size of GDS1 is only slightly larger than that of GDS2. The portion of region 40 which is contacted by electrode 50 is somewhat larger than the corresponding region 40a and, accordingly, region 22 is somewhat larger than region 22a.

Figure 3:
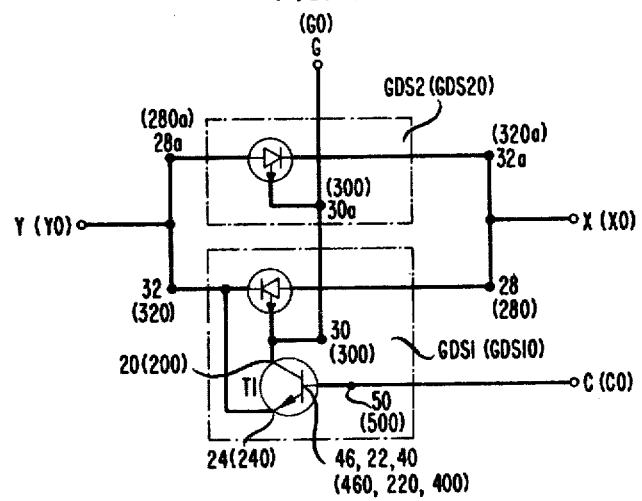
FIG. 3 illustrates an electrical equivalent circuit of the structure of FIGS. 1 and 2.

The electrical connections shown between electrodes 28 and 32a to a terminal X, electrodes 30 and 30a to a terminal G, and electrodes 32 and 28a to a terminal Y, coupled GDS1 and GDS2 together so as to form a bidirectional switching element whose equivalent circuit is illustrated in FIG. 3.

Figure 2:
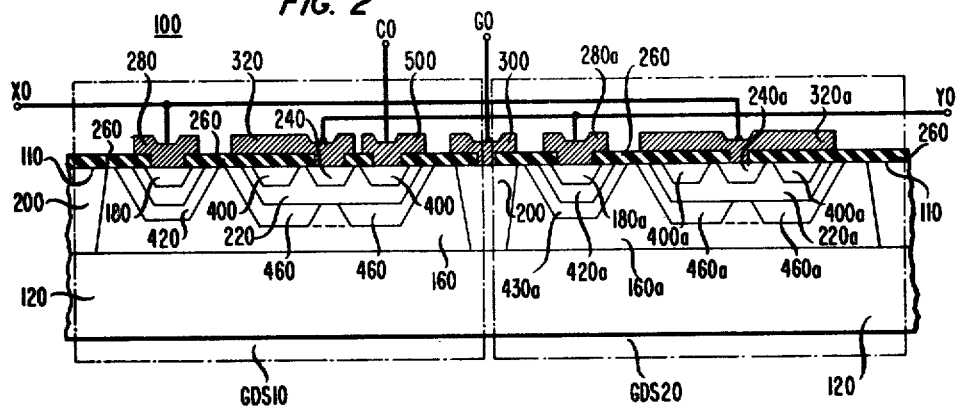
FIG. 2 illustrates a structure in accordance with another illustrative embodiment of the invention.

Referring now to FIG. 2, there is illustrated a semiconductor structure 100 comprising two gated diode switches, GDS10 and GDS20, which are illustrated within dashed line rectangles and are both formed on a semiconductor support member 120. The basic structure of GDS20 without regions 420a and 460a is disclosed and described in copending U.S. patent application Ser. No. 107,773 now abandoned, filed concurrently with the present application and in which there is a common assignee. Structure 100 is similar to structure 10 of FIG. 1 and all portions thereof which are essentially identical or similar have the same numerical reference number with an extra "0" added.

Structure 100 comprises a semiconductor support member 120 which in one embodiment is of n− type impurity concentration. Regions 200 serve to separate semiconductor regions 160 and 160a and are of n+ type conductivity so as to make low resistance contact to member 120. Semiconductor member 120 and region 200 serve as the gate regions of both GDS10 and GDS20. Semiconductor bodies 160 and 160a are of p− type conductivity and make direct contact with regions 200 and semiconductor member 120. Regions 180 and 180a serve as anode regions and regions 240 and 240a serve as cathode regions. Regions 460, 460a, 220, 220a, 400, and 400a serve as shield regions and as the bases of n-p-n transistors whose collectors are semiconductor member 120 and regions 200 and whose emitters are cathode regions 240 and 240a, respectively.

GDS10 and GDS20 operate in a very similar manner to the corresponding GDSs of FIG. 1. The operation of the n-p-n transistors comprising member 120, semiconductor regions 160 and 160a, regions 460, 460a, 220, 220a, 400, 400a, and cathode regions 240 and 240a is essentially identical to that of the n-p-n transistors of structure 10 of FIG. 1. FIG. 3 illustrates one electrical equivalent circuit of structure 100.

An integrated circuit chip containing a pair of gated diode switches of the type shown in FIG. 2 was fabricated and tested and found functional. The switches were all found functional and were able to block voltages of 500 volts in the OFF state and conducted 30 milliamperes in the ON state with a voltage drop between anode and cathode regions of 2.0 volts.

An integrated circuit chip containing eight pairs of gated diode switches of the type shown in FIG. 1, but without an electrode coupled to region 40, was fabricated. An n-p-n transistor, with the collector coupled to terminal G and the emitter coupled to terminal X was used. The combination was tested and found functional. Control circuitry coupled to the gate terminals of the GDSs was fabricated on the same integrated circuit chip. This circuitry is described in copending U.S. Pat. No. 4,250,409 and application Ser. No. 107,777 filed concurrently with this application and which have a common assignee. Each of the sixteen GDSs was fabricated on a single silicon chip. The undoped silicon support member 12 is 19 to 21 mils thick. Dielectric layer 14a is a silicon dioxide layer that is 3 to 4 microns thick. Body 16a is typically 44 to 54 microns thick, approximately 490 microns long, 300 microns wide, and is of p type conductivity with an impurity concentration in the range of approximately $5-9 \times 10^{13}$ impurities/cm$^3$. Layer 48a is of n type conductivity with an impurity concentration in the range of $5 \times 10^{13}$ to $9 \times 10^{14}$ impurities/cm$^3$ and a thickness of approximately 12 microns. Anode region 18a is of p+ type conductivity and is typically 2 to 4 microns thick, 24 microns wide, 145 microns long, and has an impurity concentration of approximately $10^{19}$ impurities/cm$^3$. Region 42a is of p type conductivity, is typically 15 microns thick, 90 microns wide, 211 microns long, and has an impurity concentration of approximately $10^{16}$ impurities/cm$^3$. Electrode 28a is typically aluminum, with a thickness of 1½ microns, a width of 74 microns, and a length of 195 microns. Gate region 20a is of n+ type conductivity and is typically 15 microns thick, 40 microns wide, 300 microns long, and has an impurity concentration of approximately $5 \times 10^{19}$ impurities/cm$^3$. Region 36 is of p+ type conductivity and is typically 2 microns thick, 15 microns wide, 15 microns long, and has an impurity concentration of approximately $10^{19}$ impurities/cm$^3$. Electrode 30a is typically aluminum, 1½ microns thick, 50 microns wide, and 320 microns long. The spacing between adjacent edges of electrodes 28a and 30a and between 30a and 32a is 40 microns in both cases. Cathode region 24a is of n+ type conductivity and is typically 1½ microns thick, 33 microns wide, 99 microns long, and has an impurity concentration of approximately $5 \times 10^{19}$ impurities/cm$^3$. Guard ring region 40a is of p+ type conductivity and is 2 microns deep, has an inner diameter of approximately 45 microns, an outer diameter of approximately 71 microns, and an impurity concentration of approximately $10^{19}$ impurities/cm$^3$. The spacing between guard ring 40a and cathode region 24a is approximately 6 microns. Region 22a is of p type conductivity, 79 microns wide, 145 microns long, 3 to 4 microns thick, and has an impurity concentration of $10^{18}$ impurities/cm$^3$. Region 46a is of p type conductivity, is 130 microns wide at the outer periphery, approximately 10 microns wide at the inner periphery (the distance between the sidewalls of region 46a where they intersect region 22a), 130 microns long at the outer periphery, 74 microns long at the inner periphery, 15 microns deep, and has an impurity concentration of $10^{16}$ impurities/cm$^3$. Electrode 32a is typically aluminum, with a thickness of 1½ microns, a width of 114 microns, and a length of 180 microns. Region 34 is of n+ type conductivity, is 15 microns wide, 15 microns long, 1½ microns deep, and has an impurity concentration of approximately $5 \times 10^{19}$ impurities/cm$^3$. Electrode 38 is typically aluminum, with a thickness of 1½ microns, a width of 15 microns, and a length of 30 microns.

Referring now to FIG. 3, there is illustrated an electrical equivalent circuit of the structures of FIGS. 1 and 2. An electrical symbol has been adopted for the basic structures of GDS2 and GDS20 of FIGS. 1 and 2, respectively. GDS1 is illustrated with this same symbol and with n-p-n transistor T1 coupled by the collector and emitter to the gate and cathode, respectively, of GDS1 and GDS10. The bidirectional switch shown in FIG. 3. is capable of conducting current from terminal X (XO) to terminal Y (YO) and vice versa. With the common gate terminal G (GO) held at a sufficiently high potential there is no conduction through the gated diode switches GDS1 (GDS10) and GDS2 (GDS20). If gate terminal G (GO) is allowed to float in potential and terminal C (CO) is adjusted so as to bias on the equivalent n-p-n transistor T1 of GDS1 (GDS10), then the common gate terminals G (GO) of GDS1 (GDS10) and GDS2 (GDS20) and the anode of GDS2 (GDS20) and the cathode of GDS1 (GDS10) are all pulled typically to within several tenths of a volt of each other and GDS1 and (GDS10) or GDS2 (GDS20) assumes the ON state depending on the operating potentials applied to the X (XO) and Y (YO) terminals.

The embodiments described herein are intended to be illustrative of the general principles of the invention. Various modifications are possible consistent with the spirit of the invention. For example, support region 12 can be of p type conductivity silicon, gallium arsenide, sapphire, or an electrically inactive material. Further, the electrodes can be doped polysilicon, gold, titanium, or other conductors. Still further, the impurity concentration levels, spacings between different regions, and other dimensions of the regions can be adjusted to allow significantly higher operating voltages and currents than are described. Additionally, other types of dielectric materials, such as silicon nitride, can be substituted for the silicon dioxide. Still further, the conductivity of all of the regions, bodies, and supports can be reversed provided the voltage polarities are appropriately changed in the manner well known in the art. This would result in what is now denoted as the anode and cathode regions becoming the cathode and anode regions, respectively. The anode would then have shield (base) regions 22 (220), 46 (460) surrounding same. Still further, the gate regions of FIG. 1 need not be directly in between the anode and cathode regions. One example of positioning of the gate is disclosed in copending U.S. patent application Ser. No. 107,772 filed concurrently with this application and now abandoned which has a common assignee. Still further, regions 42 (42a), 420 (420a), 46 (46a), 460 (460a), and 48 (48a) can be eliminated.

We claim:

1. A structure comprising:
    a first semiconductor body whose bulk is of one conductivity type and which has a major surface;
    separate first and fourth regions which are of the one conductivity type;
    separate second and third regions which are of the opposite conductivity type;
    the first, third, and fourth regions each having a portion which forms a part of the major surface;
    the fourth region surrounds the third region so as to separate it from the bulk portion of the semiconductor body;
    the first, third and fourth regions being spaced apart from each other;
    the first, second, and third regions having relatively low resistivity as compared to the bulk portion of the semiconductor body and the fourth region having a bulk portion which is of intermediate resistivity between that of the first region and the bulk portion of the semiconductor body;
    the first, second, third, and fourth regions each having a separate electrode coupled thereto;
    the fourth region and the third region forming a first semiconductor junction;
    the parameters of the various portions of the semiconductor body being such that with a forward-bias potential applied to the first and third regions and a forward-bias potential applied to the first semiconductor junction, there is facilitated a substantial current flow between the first and third regions via the bulk portion of the semiconductor body, and with the potential of the fourth region being insufficient to foward-bias the first junction and with the potential of the second region being sufficiently different from that of the first, third and/or fourth regions to cause a cross-sectional portion of the bulk of the semiconductor body between the first and third regions to be at a potential which is of greater magnitude that that of the first, third and/or fourth regions, there is facilitated an interrupting or inhibiting of current flow between the first and third regions.

2. The structure of claim 1 further comprising:
a semiconductor support member (substrate) isolated from the semiconductor body by a dielectric layer;
the support member having a separate electrode coupled thereto to a portion thereof which is adapted to facilitate electrical contact thereto; and
the second region has a portion thereof which forms part of the major surface.

3. The structure of claim 2 further comprising a plurality of semiconductor bodies which are essentially identical to the first semiconductor body, said bodies existing in the support member with each being dielectrically isolated from the other.

4. The structure of claim 3 further comprising:
an additional semiconductor body existing in the support member and being dielectrically isolated from all other bodies, said additional semiconductor body being similar to the first body and having essentially the same types of regions contained therein except that the corresponding fourth region has no electrode coupled thereto;
the various parameters of the portions of the additional semiconductor body being such that with a forward-bias potential applied to the corresponding first and third regions thereof and the potential of the second region thereof being insufficient to cause a vertical cross-sectional portion of the bulk of this semiconductor body between the corresponding first and third regions to be at a potential which is greater in magnitude than that of the potential of the corresponding first, third and/or fourth regions, there is facilitated a substantial current flow between the corresponding first and third regions via the bulk portion of the additional semiconductor body and with the potential of the corresponding second region being sufficiently different from that of the corresponding first, third, and/or fourth regions to cause a vertical cross-sectional portion of the bulk of the additional semiconductor body between the corresponding first and third regions to be greater in magnitude than that of the first, third and/or fourth regions, there is facilitated an interrupting or inhibiting of current flow between the corresponding first and third regions; and
the first and third regions of the first semiconductor body are coupled to the third and first regions, respectively, of the additional semiconductor body and the second regions of both bodies are coupled together so as to form a bidirectional switch.

5. The structure of claim 1 further comprising a semiconductor support member (substrate), said member being in contact with a bottom surface of the semiconductor body and serving as the second region of the structure.

6. The structure of claim 5 wherein the semiconductor support member has a portion thereof which extends to the major surface and has a separate electrode coupled thereto.

7. The structure of claim 6 further comprising:
an additional semiconductor body existing in the support member, the additional semiconductor body being similar to the first semiconductor body and having the same types of regions contained therein except that the corresponding fourth region has an electrode coupled thereto and the various parameters of the portions of the additional body being such that with a forward-bias potential applied to the corresponding first and third regions and the potential of the corresponding second region being insufficient to cause a vertical cross-sectional portion of the bulk of the additional body between the corresponding first and third regions thereof to be at a potential which is greater in magnitude than that of the corresponding first, second, and/or third regions thereof, there is facilitated a substantial current flow between the corresponding first and third regions thereof via the bulk portion of the additional semiconductor body, and with the potential of the second region being sufficiently different from that of the corresponding first, third, and fourth regions thereof to cause a vertical cross-sectional portion of the bulk of the additional semiconductor body between the corresponding first and third regions thereof to be at a potential which is of greater magnitude than that of the corresponding first, third and/or fourth regions thereof, there is facilitated an interrupting or inhibiting of current flow between the corresponding first and third regions thereof;
and
the first and third regions of the first semiconductor body are coupled to the third and first regions, respectively, of the additional semiconductor body and the second regions of the first and additional semiconductor bodies being coupled together so as to form a bidirectional switch.

8. A structure comprising:
a semiconductor body whose bulk is of the one conductivity type and which has a major surface;
first and fourth regions which are of the one conductivity type;
second and third regions which are of the opposite conductivity type; p1 each of the first, third, and fourth regions having a portion which forms a part of the major surface;
the fourth region surrounds the third region so as to separate it from the bulk portion of the semiconductor body;
the first, second, and fourth regions being spaced apart from each other;
the first, second and third regions being of relatively low resistivity as compared to the bulk portion of the semiconductor body;
the fourth region having a bulk portion which has a resistivity which is intermediate between that of the bulk portion of the semiconductor body and the first region; and
each of the regions having a separate electrode coupled thereto.

9. The structure of claim 8 further comprising a semiconductor support member isolated from the semiconductor body by a dielectric layer with the support member having a portion thereof which is common with the major surface and having a separate electrode coupled thereto to a portion thereof which is adapted to provide electrical contact thereto.

10. The structure of claim 9 wherein the parameters of the various portions of the body being such that with a forward-bias potential applied between the first and third regions and a forward-bias potential applied between the fourth and third regions there is facilitated a substantial current flow between the first and third regions via the bulk portion of the semiconductor body, and with less than a forward-bias potential being applied between the third and fourth regions and with the potential of the second region being sufficiently different from that of the first, third and/or fourth regions to essentially cause a cross-sectional portion of the bulk portion of the semiconductor body between the first and third regions to be greater in magnitude than the potential of the first, third, and/or fourth regions, there is facilitated an interrupting or inhibiting of current flow between the first and third regions.

* * * * *